(12) United States Patent
Aksamit

(10) Patent No.: US 7,170,327 B2
(45) Date of Patent: Jan. 30, 2007

(54) SYSTEM AND METHOD FOR DATA RETENTION WITH REDUCED LEAKAGE CURRENT

(75) Inventor: Randy J. Aksamit, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 515 days.

(21) Appl. No.: 10/608,055

(22) Filed: Jun. 27, 2003

(65) Prior Publication Data

US 2004/0266092 A1 Dec. 30, 2004

(51) Int. Cl.
*H03K 3/289* (2006.01)
(52) U.S. Cl. .................................. 327/202; 327/544
(58) Field of Classification Search ................. 327/202, 327/203, 544; 365/226–229
See application file for complete search history.

(56) References Cited

U.S. PATENT DOCUMENTS

| | | | |
|---|---|---|---|
| 5,801,576 A * | 9/1998 | Ooishi | 327/530 |
| 5,880,623 A * | 3/1999 | Levinson | 327/540 |
| 6,049,245 A * | 4/2000 | Son et al. | 327/544 |
| 6,246,265 B1 * | 6/2001 | Ogawa | 326/95 |
| 6,307,396 B1 * | 10/2001 | Mulatti et al. | 326/71 |
| 6,535,433 B2 * | 3/2003 | Ooishi | 365/189.05 |
| 6,538,471 B1 * | 3/2003 | Stan et al. | 326/46 |
| 6,556,071 B2 * | 4/2003 | Notani et al. | 327/544 |
| 6,977,519 B2 * | 12/2005 | Bhavnagarwala et al. | 326/34 |

\* cited by examiner

*Primary Examiner*—Kenneth B. Wells
(74) *Attorney, Agent, or Firm*—Schwegman, Lundberg, Woessner & Kluth, P.A.

(57) ABSTRACT

In embodiments, a data-retention circuitry comprises data-retention inverters in a feedback loop, an isolation subcircuit to isolate the inverters from a pass-gate subcircuit in response to a sleep signal, and a supply-switching subcircuit to provide current to the data-retention inverters from a supplemental voltage supply through a well tap during a standby mode. The supply-switching subcircuit switches from a regular voltage supply to the supplemental voltage supply in response to the sleep signal.

19 Claims, 6 Drawing Sheets

US 7,170,327 B2

SYSTEM AND METHOD FOR DATA RETENTION WITH REDUCED LEAKAGE CURRENT

TECHNICAL FIELD

Embodiments of the present invention pertain to integrated circuits and, in particular, to processing systems that retain data, such as state information.

BACKGROUND

Modern semiconductor processing technology has advanced rapidly with increased transistor density, reduced chip area and improved transistor performance. In many cases, these advancements have come at the expense of increased leakage power. In the past, this leakage power has been small in comparison to the total chip power; however, with advancing technologies, leakage power is becoming an increasingly larger percentage. Part of the reason for this increase in leakage power is that many newer technologies rely more on higher-leakage semiconductor devices, which may have shorter channel lengths, thinner gate-oxide layers and/or lower threshold voltages than semiconductor devices of more conventional processing technologies.

This increasing leakage power is especially a concern for systems and devices that rely heavily on batteries. Such systems and devices may utilize a standby mode to reduce their power consumption. During standby mode, many active components are powered down; however, some active components require power to retain the current state for the processing elements. During standby mode, the active components used to retain state information may continue to draw at least a leakage current. As a result, an increase in power consumption due to this increase in leakage current may result during standby. Thus, there are needs for systems and methods for retaining data and state information with reduced leakage.

BRIEF DESCRIPTION OF THE DRAWINGS

The appended claims are directed to some of the various embodiments of the present invention. However, the detailed description presents a more complete understanding of embodiments of the present invention when considered in connection with the figures, wherein like reference numbers refer to similar items throughout the figures and:

DETAILED DESCRIPTION

The following description and the drawings illustrate specific embodiments of the invention sufficiently to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. The scope of embodiments of the invention encompasses the full ambit of the claims and all available equivalents of those claims.

Figure 1:
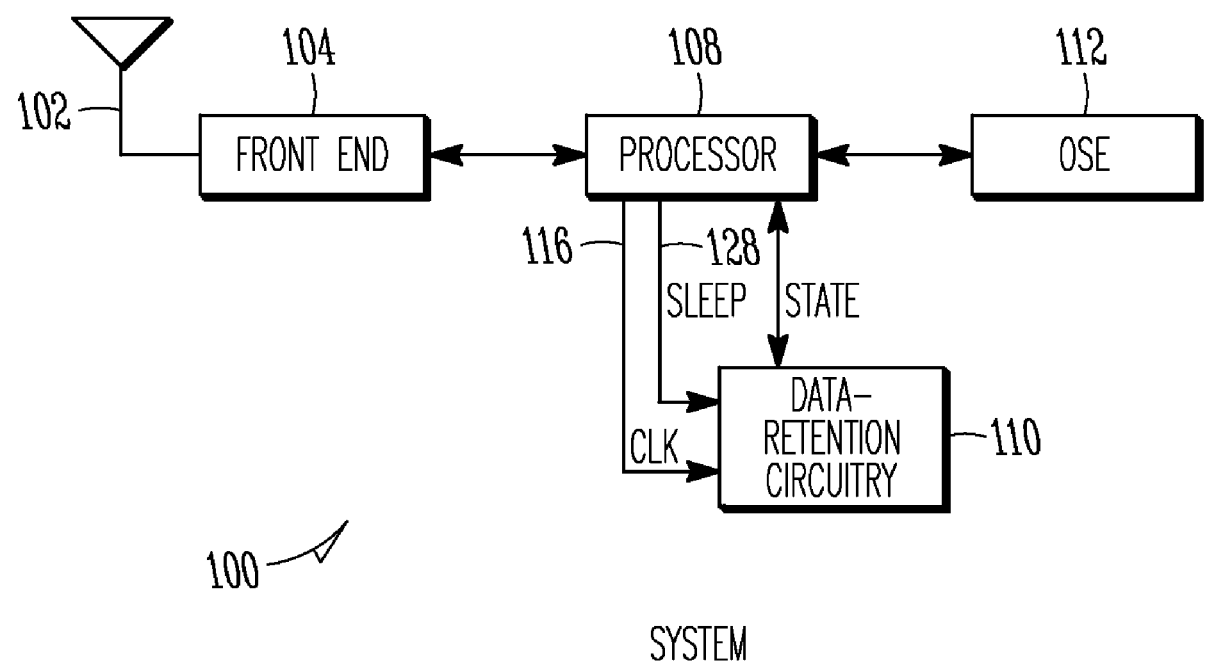
FIG. 1 is a block diagram of a processing system in accordance with embodiments of the present invention.

FIG. 1 is a block diagram of a processing system in accordance with embodiments of the present invention. System 100 may be part of any computing or processing system including computer systems, server systems, and wireless communication devices, as well as other systems. System 100 comprises one or more processors 108 and data-retention circuitry 110 to retain state information for processing element 108. Processors 108 may operate with other system elements (OSE) 112 in performing functions for which system 100 is intended. In some embodiments, processors 108 and data-retention circuitry 110 may be on the same semiconductor die.

In embodiments, data-retention circuitry 110 may function as flip-flops, trigger circuits, or bi-stable multi-vibrators used to communicate and hold state information within system 100. In some embodiments, data-retention circuitry 110 may actually be part of processors 108. Data-retention circuitry 110 may have two stable states. In one state, a first stage may conduct and a second stage may be cut off, while in the other state, the second stage may conduct and the first stage may be cut off. A trigger signal, such as clock signal 116, may change an element from one state to the other. Accordingly, data-retention circuitry 110 may be in one of the two states depending both on the input received and on which state it was in when the input was received.

During a standby mode, data-retention circuitry 110 may receive current from a supplemental voltage supply to retain their state rather than a regular voltage supply. In embodiments, data-retention circuitry 110 may receive sleep signal 128 shortly before standby mode. Data-retention circuitry 110 may retain current state information during a standby mode when, for example, the regular voltage supply is turned off or shorted to ground. In embodiments, data-retention circuitry 110 may include a plurality of data retention circuits. The data retention circuits may include data-retention subcircuits in a feedback loop, an isolation subcircuit to isolate the data-retention subcircuits from a pass-gate subcircuit in response to a sleep signal, and a supply-switching subcircuit to provide current to the data-retention subcircuits from a supplemental voltage supply through a well tap during standby mode.

The supply-switching subcircuit may switch from a regular voltage supply to the supplemental voltage supply in response to sleep signal 128. The isolation subcircuit may pass data signals between the data-retention subcircuits and the pass-gate subcircuit when voltage from the regular voltage supply is present. The data-retention subcircuits, switching subcircuit and the isolation subcircuit, along with an output inverter may be part of slave latch of one of data-retention circuitry 110. The data-retention subcircuits, switching subcircuit and the isolation subcircuit may comprise lower-leakage semiconductor devices, and the pass-gate subcircuit, the output inverter and elements of a master latch may comprise higher-leakage semiconductor devices. The lower-leakage devices may have, for example, a longer channel length, a thicker gate-oxide layer and/or a higher threshold voltage than the higher-leakage semiconductor devices, although the scope of the invention is not limited in this respect.

In some embodiments, system 100 may be a wireless communication device and may include a receiver and/or transmitter as part of front-end circuitry 104. In these embodiments, front-end circuitry 104 may receive and/or transmit radio-frequency (RF) communication signals through antenna 102. In these embodiments, system 100 may be a personal digital assistant (PDA), a laptop or portable computer with wireless communication capability, a web tablet, a wireless telephone, a wireless headset, a pager, an instant messaging device, an MP3 player, a digital camera, an access point, or other device that may receive and/or transmit information wirelessly. In these embodiments, front-end circuitry 104 may receive and/or transmit RF communications in accordance with specific communication standards, such as the IEEE 802.11(a), 802.11(b) and/or 802.11(g) standards for wireless local area network (LAN) standards, although front-end circuitry 104 may receive and/or transmit communications in accordance with other techniques including Digital Video Broadcasting Terrestrial (DVB-T) broadcasting standard, and the High performance radio Local Area Network (HiperLAN) standard.

Antenna 102 may comprise a directional or omnidirectional antenna such as a dipole antenna, a monopole antenna, a loop antenna, a microstrip antenna or other type of antenna suitable for reception and/or transmission of RF signals, which may be processed by system 100. Front end elements 104 may provide converted RF signals to processors 108 for conversion to data signals for use by other system elements (OSE) 112 as part of the operation of system 100. Processors 108 may also provide data signals to front-end circuitry 104 for converting to RF signals for transmission by antenna 102.

Although system 100 is illustrated as having several separate functional elements, one or more of the functional elements may be combined and may be implemented by combinations of software-configured elements, such as processing elements, including digital signal processors (DSPs), and/or other hardware elements. For example, processing elements may comprise one or more microprocessors, DSPs, application specific integrated circuits (ASICs), and combinations of various hardware and logic circuitry for performing at least the functions described herein.

Figure 2:
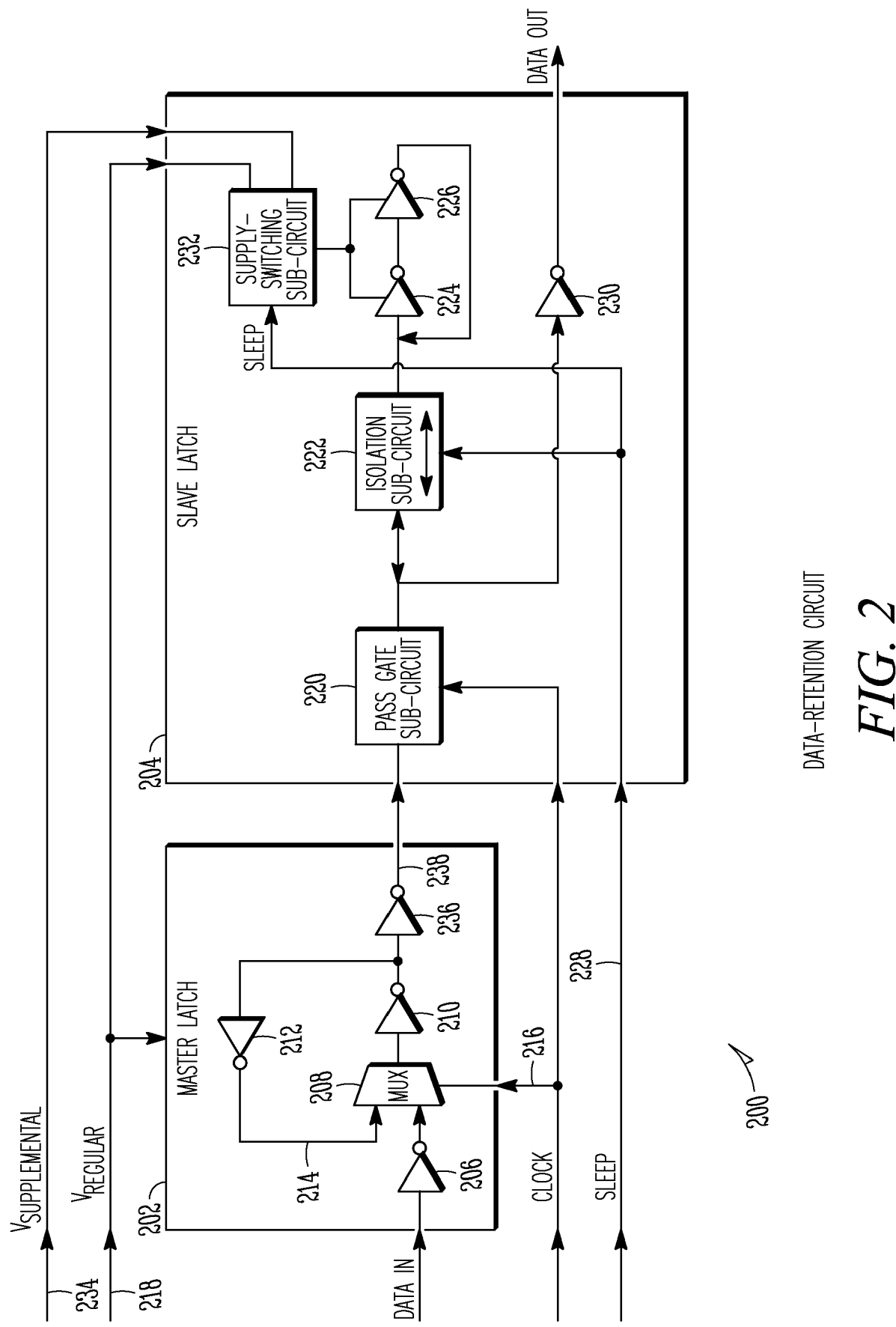
FIG. 2 is a block diagram of a data-retention circuitry in accordance with embodiments of the present invention.

FIG. 2 is a block diagram of a data-retention circuitry in accordance with embodiments of the present invention. Data-retention circuit 200 may be suitable for use as one circuit of a plurality of data-retention circuits that may comprise data-retention circuitry 110 (FIG. 1), although other elements may also be suitable. Data-retention circuit 200 may retain current state information during standby mode when, for example, the regular voltage supply is turned off or shorted to ground.

In embodiments, data-retention circuit 200 may function as a flip-flop, a trigger circuit, or a bi-stable multi-vibrator, which has two stable states. In one state, a first stage may conduct and a second stage may be cut off, while in the other state, the second stage may conduct and the first stage may be cut off. A trigger signal, such as a clock signal, may change the circuit from one state to the other. Accordingly, data-retention circuit 200 may be in one of the two states, depending both on the input received and on which state it was in when the input was received.

Data-retention circuit 200 may include master latch 202 and slave latch 204. Master latch 202 includes inverter 206 to receive an input data signal, and multiplexer 208 to select between the output of inverter 206 and feedback signal 214 in response to clock signal 216. Master latch 202 also includes inverters 210 and 212 arranged in series in a feedback loop to generate feedback signal 214. The data signals received by master latch 202 may be data representing state information for a processing system or a processing element, such as one or more of processors 108 (FIG. 1).

Inverters 206, 210, 212 and 236 and multiplexer 208 may comprise higher-leakage devices that receive regular voltage supply 218 (e.g., Vcc). To help reduce power consumption during a standby mode, these devices may be turned off by switching off the regular voltage supply, and/or shorting the regular voltage supply to ground or Vss.

Slave latch 204 comprises pass-gate subcircuit 220 and isolation subcircuit 222. Pass-gate subcircuit 220 passes output signal 238 of master latch 202 to isolation subcircuit 222 and output inverter 230 in response to clock signal 216. Slave latch 204 also comprises data-retention subcircuits 224 and 226 arranged in series in a feedback loop. Isolation subcircuit 222 isolates subcircuits 224 and 226 from pass-gate subcircuit 220 when receiving sleep signal 228, which may be during a standby mode. Otherwise, isolation subcircuit 222 passes signals between pass-gate subcircuit 220 and subcircuits 224 and 226. In embodiments, isolation subcircuit 222 may pass signals when not receiving sleep signal 228 and/or when receiving regular voltage supply 218. Slave latch 204 also comprises output inverter 230 to provide an output from isolation subcircuit 222 and/or pass-gate subcircuit 220. The output may be data representing a state or state information for a processor or processing element, such as one of processors 108 (FIG. 1). In embodiments, data-retention subcircuits 224 and 226 may be inverters, inverter amplifiers or other devices that may retain a state.

In accordance with some embodiments of the present invention, slave latch 204 may also comprise supply-switching subcircuit 232, which provides data-retention subcircuits 224 and 226 with a voltage supply. In response to sleep signal 228, supply-switching subcircuit 232 switches between regular voltage supply 218 and supplemental voltage supply 234. During a standby mode, regular voltage supply 218 may be turned off, and supply-switching subcircuit 232 may allow current to be supplied to subcircuits 224 and 226 from supplemental voltage supply 234. Accordingly, data-retention subcircuits 224 and 226 may retain their current state during standby. This may allow the state of a system having many data-retention circuitry to be recovered quickly after standby.

In the embodiments illustrated in FIG. 2, supply-switching subcircuit 232 is part of slave latch 204, although the scope of the invention is not limited in this respect. In some embodiments, supply-switching subcircuit 232 may be external to circuit 200. In some embodiments, supply-switching subcircuit 232 may be located elsewhere and may be a part of system level circuitry. For example, one or more supply-switching subcircuits 232 may couple to data-retention circuitry 110 (FIG. 1) of system 100 (FIG. 1). This may eliminate routing a supplemental supply voltage to each individual data-retention circuitry.

In some embodiments, switching subcircuit 232, isolation subcircuit 222, and subcircuits 224 and 226 may operate during a standby mode and may comprise lower-leakage semiconductor devices. In these embodiments, pass-gate subcircuit 220 and inverter 230 may comprise higher-leakage semiconductor devices, and may be turned off in the standby mode. The higher-leakage semiconductor devices may provide better performance during non-standby operations. As can be appreciated, in a system such as system 100 (FIG. 1) that may employ hundreds of thousands of circuits 200, the use of a standby mode may reduce current consumption considerably while retaining system state information.

In some embodiments, a supplemental voltage may be supplied by a well tap in the semiconductor die. In these embodiments, during the standby mode, current may flow from a supplemental voltage supply through an n-well and well tap to data-retention subcircuits 224 and 226. Examples of this are described in more detail below. Although an n-well is generally resistive, there may be little or no voltage drop since there may be no active switching during standby, and the only current drawn may be for retaining state information.

Figure 3:
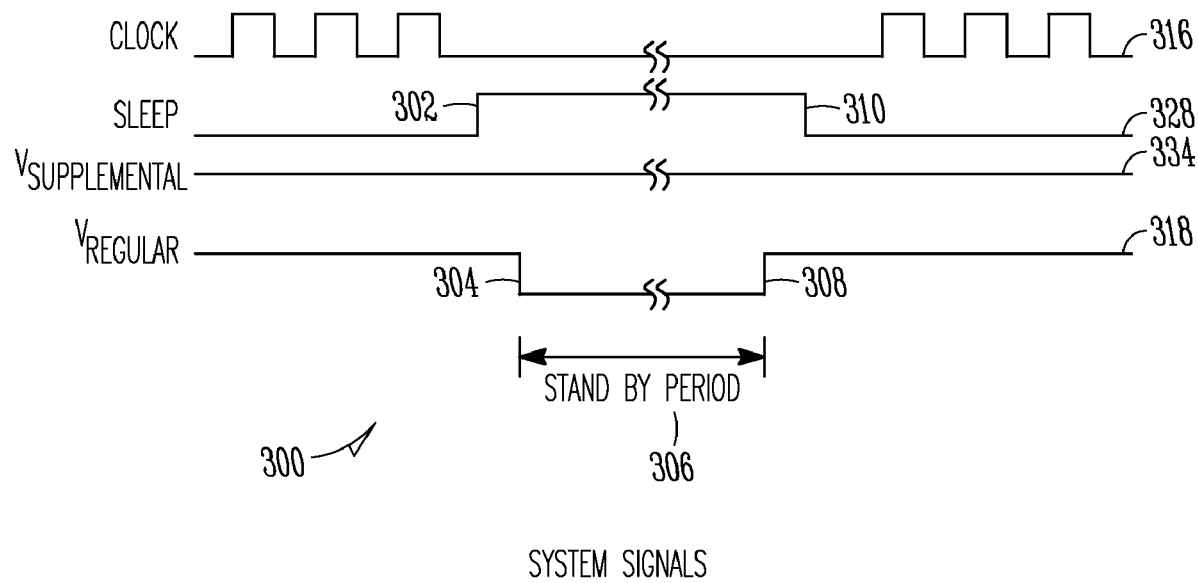
FIG. 3 is an illustration of some system signals in accordance with embodiments of the present invention.

FIG. 3 is an illustration of some system signals in accordance with embodiments of the present invention. Signals 300 may be suitable for use in a system, such as system 100 (FIG. 1). Signals 300 may also be suitable for use by data-retention circuit 200 (FIG. 2). Signals 300 include clock signal 316, which may be generated by a system clock, sleep signal 328 to indicate when a system is going into a standby mode, supplemental supply signal 334 to indicate a voltage level of a supplemental voltage supply, and regular supply signal 318 to indicate an available voltage level of the regular voltage supply. In embodiments, clock signal 316 may correspond to clock signal 216 (FIG. 2), sleep signal 328 may correspond to sleep signal 228 (FIG. 2), supplemental supply signal 334 may correspond to the voltage level of supplemental voltage supply 234 (FIG. 2), and regular supply signal 318 may correspond to the voltage level of regular voltage supply 218 (FIG. 2).

In accordance with embodiments of the present invention, just prior to going into standby mode, sleep signal 328 may change state (e.g., may go high) at time 302. This may cause an isolation subcircuit, such as isolation subcircuit 222 (FIG. 2), to isolate data-retention subcircuits, such as subcircuits 224 and 226 (FIG. 2), from a pass-gate subcircuit, such as pass-gate subcircuit 220 (FIG. 2). This may also cause a supply-switching subcircuit, such as supply-switching subcircuit 232 (FIG. 2), to switch data-retention subcircuits from the regular voltage supply to the supplemental voltage supply. When the regular voltage supply is turned off at time 304, the data-retention subcircuits that receive current from the supplemental voltage supply may retain their state during standby period 306. After standby period 306, the regular voltage supply may be switched on at time 308, bringing devices within the data-retention circuitry into operation. Shortly after the regular voltage supply is switched on at time 308, the sleep signal may change state (e.g., may go low) at time 310, allowing the supply-switching subcircuit to switch the data-retention subcircuits to the regular voltage supply. As indicated by signals 300, clock signal 316 may not be required during standby period 306.

In embodiments, signals 300 may be provided by a processor or processing element, such as one or more of processors 108 (FIG. 1). In some embodiments, a processing system or wireless communication device may go into standby mode many times a second to conserve power. In some cases, such systems and devices may remain in the standby mode for many seconds or minutes and even longer.

Figure 4:
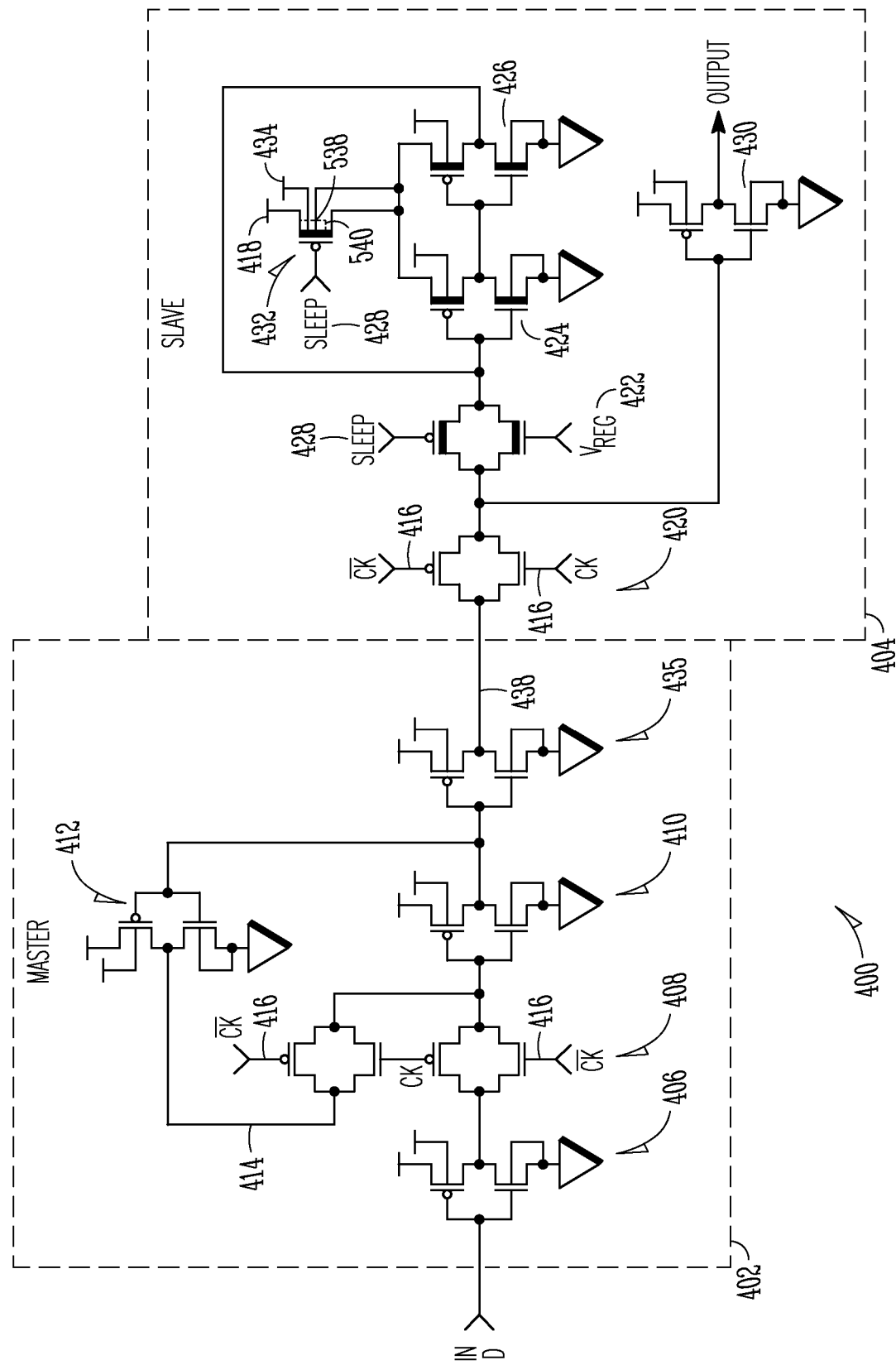
FIG. 4 is an example circuit diagram of a data-retention circuitry in accordance with embodiments of the present invention.

FIG. 4 is an example circuit diagram of a data-retention circuitry in accordance with embodiments of the present invention. Data-retention circuitry 400 may be suitable for use as data-retention circuit 200 (FIG. 2) although other circuits are also suitable for use as data-retention circuit 200 (FIG. 2).

Data-retention circuitry 400 may include master latch 402 and slave latch 404. Master latch 402 includes inverter 406 to receive an input data signal, and multiplexer 408 to select between the output of inverter 406 and feedback signal 414 in response to clock signal 416. Master latch 402 also includes inverters 410 and 412 arranged in series in a feedback loop to generate feedback signal 414. The data signals received by master latch 402 may be data representing state information for a processing system or a processing element, such as one or more of processors 108 (FIG. 1), although the scope of the invention is not limited in this respect.

Inverters 406, 410, 412 and 436 and multiplexer 408 may comprise higher-leakage devices that receive regular voltage supply 418 (e.g., Vcc). To help reduce power consumption during a standby mode, these devices may be turned off by switching off the regular voltage supply, and/or shorting the regular voltage supply to ground or Vss.

Slave latch 404 comprises pass-gate subcircuit 420 and isolation subcircuit 422. Pass-gate subcircuit 420 passes output signal 438 from master latch 402 to isolation subcircuit 422 and output inverter 430 in response to clock signal 416. Slave latch 404 also comprises data-retention subcircuits 424 and 426 arranged in series in a feedback loop. Isolation subcircuit 422 isolates devices 424 and 426 from pass-gate subcircuit 420 when receiving sleep signal 428, which may be during a standby mode. Otherwise, isolation subcircuit 422 passes signals between pass-gate subcircuit 420 and devices 424 and 426. In embodiments, isolation subcircuit 422 may pass signals when not receiving sleep signal 428 and/or when receiving regular voltage supply 418. Slave latch 404 also comprises output inverter 430 to provide an output from isolation subcircuit 422 and/or pass-gate subcircuit 420. The output may be data representing a state or state information for a processor or processing element, such as one of processors 108 (FIG. 1). Although devices 424 and 426 are illustrated as inverters, devices 424 and 426 may comprise any device that retains information.

In accordance with embodiments of the present invention, slave latch 404 also comprises supply-switching subcircuit 432, which provides data-retention subcircuits 424 and 426 with a voltage supply. In response to sleep signal 428, supply-switching subcircuit 432 switches between regular voltage supply 418 and supplemental voltage supply 434. During a standby mode, regular voltage supply may be turned off, and supply-switching subcircuit 432 may allow current to be supplied to devices 424 and 426 from supplemental voltage supply 434. Accordingly, data-retention subcircuits 424 and 426 may retain their current state during standby. This may allow the state of a system having many data-retention circuitry to be recovered quickly after standby.

In some embodiments, switching subcircuit 432, isolation subcircuit 422, and devices 424 and 426 may operate during a standby mode and may comprise lower-leakage semiconductor devices. In these embodiments, pass-gate subcircuit 420 and inverter 430 may comprise higher-leakage semiconductor devices, and may be turned off in the standby mode. The higher-leakage semiconductor devices may provide better performance during non-standby operations. As can be appreciated, in a system that employs hundreds of thousands of circuits 400, the use of a standby mode may reduce current consumption considerably while retaining system state information.

In one embodiment, supplemental voltage may be supplied through an n-well and well tap in the semiconductor die. In this embodiment, during the standby mode, current may flow from a supplemental voltage supply through the well tap to data-retention subcircuits 424 and 426. Examples of this are described in more detail below.

In embodiments, the supply-switching subcircuit 432 may be a semiconductor device, such as a PMOS (P-channel metal-oxide semiconductor) device, which conducts when sleep signal 428 is low, coupling devices 424 and 426 to regular voltage supply 418. In these embodiments, switching subcircuit 432 and data-retention subcircuits 424 and 426 may have a well tap coupled with supplemental voltage supply 434. The well tap may allow current from the supplemental voltage supply to flow through the tap to data-retention subcircuits 424 and 426 when sleep signal 428 is high even though subcircuit 432 is not receiving regular voltage supply 418. In these embodiments, the current provided through the tap may be limited to the leakage current of data-retention subcircuits 424 and 426 when in standby mode, although the scope of the invention is not limited in this respect.

In embodiments, subcircuits 424 and 426, switching subcircuit 432 and isolation subcircuit 428 may comprise lower-leakage complementary metal-oxide semiconductor (CMOS) devices, although the scope of the invention is not limited in this respect. Pass-gate subcircuit 420, inverters 406, 410, 412 and 434, and multiplexer 408 may comprise higher-leakage CMOS devices. The lower-leakage devices may have, for example, a longer channel length, a thicker gate-oxide layer and/or a higher threshold voltage depending on the particular process technology utilized, although the scope of the invention is not limited in this respect. Embodiments of the present invention may be applicable to almost any technology or mix of technologies, including technologies in which some devices have a relatively higher leakage and other devices have a relatively lower leakage. Examples of some suitable technologies include bipolar technologies and Gallium-Arsenide (GaAs) technologies, although the scope of the invention is not limited in this respect. In some embodiments, silicon-on-insulator (SOI) technology may be used.

In some embodiments, isolation subcircuit 422 receives the supply voltage which serves as a control signal although the scope of the invention is not limited in this respect. In other embodiments, the inverse of sleep signal 428 may be used.

In some embodiments, isolation subcircuit 422 and pass-gate subcircuit 420 may be combined although the scope of the invention is not limited in this respect. In these embodiments, isolation subcircuit 422 and pass-gate subcircuit 420 may share a lower transistor element to receive clock signal 416. The shared lower transistor element may be a lower-leakage semiconductor device. Embodiments of the present invention may include almost any combination of elements that provide the isolation and signal-passing functionality of subcircuits 422 and 422 and are not limited to the examples described herein.

Figure 5:
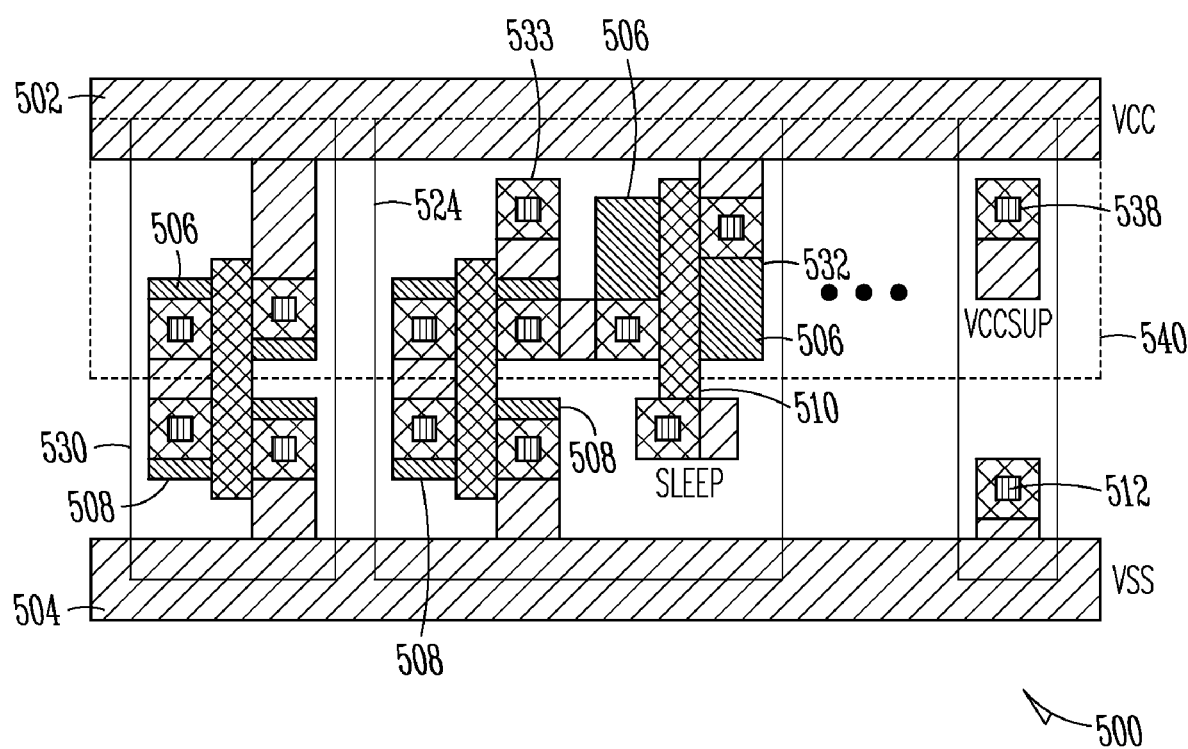
FIG. 5 illustrates a portion of a semiconductor die in accordance with embodiments of the present invention.

FIG. 5 illustrates a portion of a semiconductor die in accordance with embodiments of the present invention. Portion 500 of the semiconductor die may be suitable for use as a die that includes the semiconductor devices of data-retention circuit 200 (FIG. 2) or data-retention circuitry 400 (FIG. 4). Portion 500 includes one or more well taps 533 and 538, some of which may provide current to some devices from a supplemental voltage supply when a regular voltage supply is not available. Although well taps 533 and 538 are illustrated and described herein as n-well taps, the scope of the invention is not limited in this respect. In some embodiments, p-well taps may be used depending on the particular semiconductor device. In some embodiments, the data-retention circuitry is arranged in cells on the semiconductor die. The cells may have at least one well tap to provide current from the supplemental voltage supply of an associated one of the cells.

In accordance with some embodiments, well tap 538, may be a supply tap and may be used to supply n-well 530 during normal operation, along with providing current for data retention in standby mode. Well-tap 538 may be connected to a voltage supply (e.g., Vcc), which may be at the same voltage as the supply voltage during normal operation. In embodiments, a plurality of well taps, such as well tap 538 may be placed at a regular distance (e.g., on a per cell basis) in order to bias n-well 530, but they are not necessarily required in every cell. Well tap 533, may be a pickup tap, and may connect to n-well 530 and supply the supply voltage to inverter 524, which may correspond, for example, to retention subcircuit 424 (FIG. 4), although the scope of the invention is not limited in this respect. Supply switch 532 may turn off when a sleep signal, such as sleep signal 428 (FIG. 4) goes high. Supply switch 532 may correspond to supply-switching subcircuit 432 although the scope of the invention is not limited in this respect. Inverter 530 may be any regular inverter of a data-retention circuitry and may be supplied by the supply voltage.

In embodiments, n-well 530 may be a region of lightly-doped n-type silicon (n−), used as the substrate to build p-MOS transistors, although the scope of the invention is not limited in this respect. The well may be biased using the same voltage supply as the source of the p-MOS devices (e.g., Vcc). In many processes, the n-well may be moderately resistive (e.g., 1 K Ohm/square), although the scope of the invention is not limited in this respect. In embodiments, well taps 533 and 538 may be n+diffusion regions that connect or "tap" in to n-well 530. Because the well taps may comprise the same type (n+) as n-well 530 (n−), well taps may provide a low-resistance connection to properly bias the n-well, although the scope of the invention is not limited in this respect.

Portion 500 may also include conductive regions 502 and 504 which may respectively provide a supply voltage (e.g., Vcc) and ground (e.g., Vss), p-diffusion regions 506, n-diffusion regions 508, poly regions 510 and contacts 512, although the scope of the invention is not limited in this respect.

Figure 6:
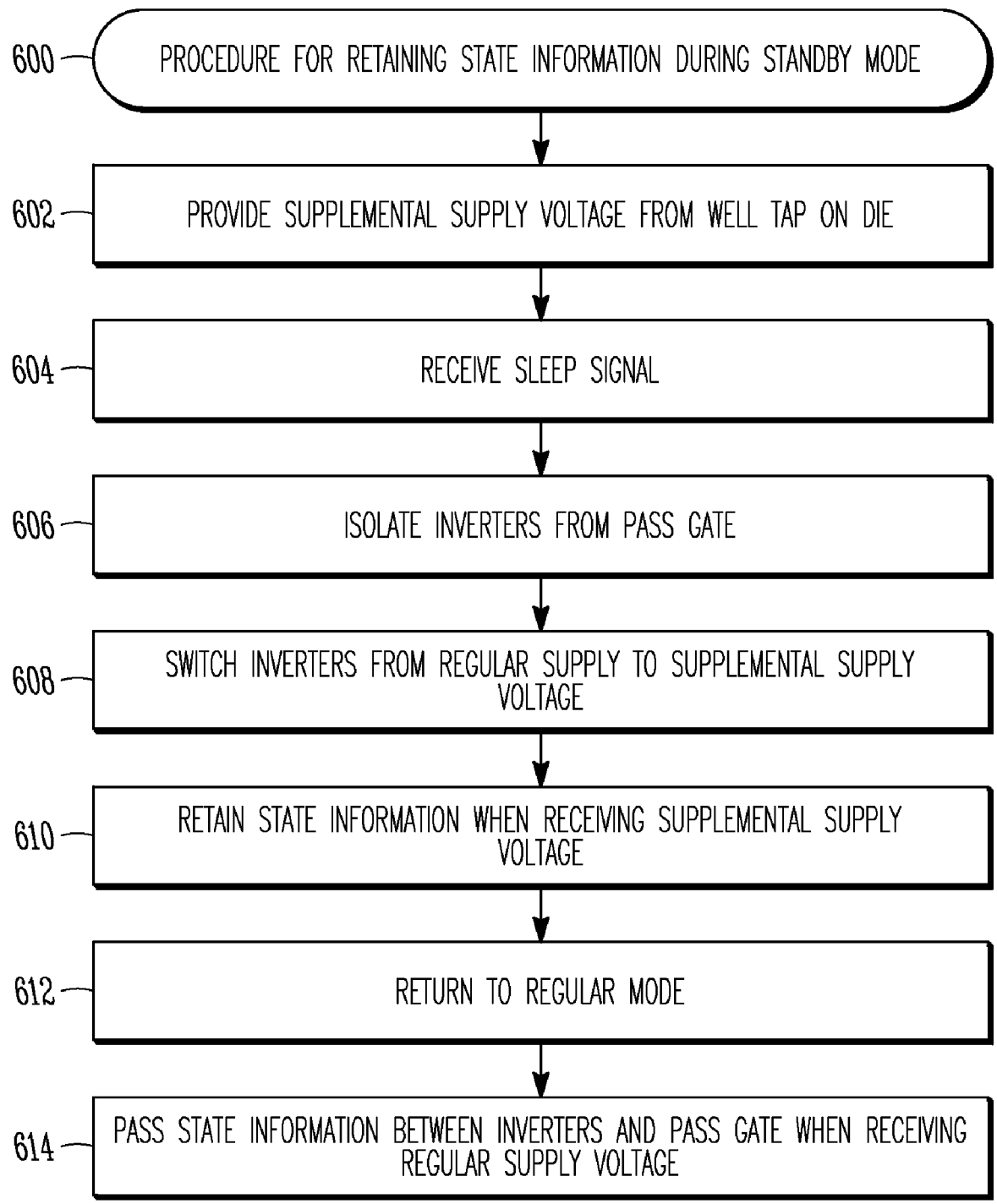
FIG. 6 is a flow chart of a data-retention procedure in accordance with embodiments of the present invention.

FIG. 6 is a flow chart of a data-retention procedure in accordance with embodiments of the present invention. Procedure 600 may be performed by one or more data-retention circuitry, such as data-retention circuitry 110 (FIG. 1), although other elements may be suitable for performing procedure 600. In embodiments, data-retention circuit 200 (FIG. 2) or data-retention circuitry 400 (FIG. 4) may also perform procedure 600. Although the individual operations of procedure 600 are illustrated and described as separate operations, one or more of the individual operations may be performed concurrently, and nothing requires that the operations be performed in the order illustrated.

In operation 602, a supplemental voltage supply is provided to a well tap on a semiconductor die. In various embodiments, the well tap may correspond to well-tap 533 (FIG. 5) and the supplemental voltage supply may correspond to supplemental voltage supply 434 (FIG. 4). In operation 604, a sleep signal is received by the data-retention subcircuit. The sleep signal may be provided by a system-level component such as processing element 108 (FIG. 1) and may correspond to sleep signal 128 (FIG. 1). In some embodiments, operation 602 may be performed when power to the chip is turned on.

In operation 606, data-retention subcircuits, such as data-retention subcircuits 224 and 226 (FIG. 2), are isolated from a pass gate, such as pass gate 220 (FIG. 2). Operation 606 may be performed by an isolation subcircuit such as isolation subcircuit 222 (FIG. 2) in response to the sleep signal.

In operation 608, the data-retention subcircuits are switched from a regular voltage supply to the supplemental voltage supply provided in operation 602. Operation 608 may be performed by a supply-switching subcircuit, such as supply-switching subcircuit 232 (FIG. 2) in response to the sleep signal.

In operation 610, the data-retention subcircuits retain their current state when the regular voltage supply is turned off. In operation 612, the system may return to a non-standby mode, which may be indicated by the sleep signal changing state shortly after the regular voltage supply is switched on.

In operation 614, the state information retained by the data-retention subcircuits may be passed through an isolation subcircuit in response to the changed state of the sleep signal. An output inverter, such as inverter 230 (FIG. 2) may provide the retained state information to a system component.

Thus, systems and methods for retaining data and state information have been described. It is emphasized that the Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

In the foregoing detailed description, various features are occasionally grouped together in a single embodiment for the purpose of streamlining the disclosure. This method of disclosure is not to be interpreted as reflecting an intention that the claimed embodiments of the subject matter require more features that are expressly recited in each claim. Rather, as the following claims reflect, inventive subject matter lies in less than all features of a single disclosed embodiment. Thus the following claims are hereby incorporated into the detailed description, with each claim standing on its own as a separate preferred embodiment.

What is claimed is:

1. A data-retention circuit fabricated on a semiconductor die comprising:
   data-retention subcircuits;
   a supply-switching subcircuit to decouple the data-retention subcircuits from a regular voltage supply during standby mode; and
   an isolation subcircuit to isolate the data-retention subcircuits from a pass-gate subcircuit in response to a sleep signal,
   wherein the supply-switching subcircuit has a well tap coupled to the data retention subcircuits and the semiconductor die has a resistive n-well coupling a supplemental supply voltage to the well tap,
   wherein during standby mode, the supplemental supply voltage biases the resistive n-well allowing leakage current to flow from the supplemental supply voltage through the resistive n-well to the well tap to bias the data-retention subcircuits to allow the data-retention subcircuits to remain powered and retain their state,
   wherein the data-retention subcircuits, the supply-switching subcircuit and the isolation subcircuit comprise lower-leakage semiconductor devices, and
   wherein the pass-gate subcircuit comprises higher-leakage semiconductor devices, the lower-leakage devices having at least one of a longer channel length, a thicker gate-oxide layer or a higher threshold voltage than the higher-leakage semiconductor devices.

2. The data-retention circuit of claim 1 wherein the isolation subcircuit is to pass data signals between the data-retention subcircuits and the pass-gate subcircuit when voltage from the regular voltage supply is present, and
   wherein the isolation subcircuit and the data-retention subcircuits are outside a data path operable when voltage from the regular voltage supply is present.

3. The data-retention circuit of claim 1 wherein the data-retention subcircuits are to retain a state when drawing the leakage current from the resistive well,
   wherein the data-retention subcircuits and supply-switching subcircuits comprise semiconductor devices fabricated on the semiconductor die, and
   wherein the leakage current comprises primarily leakage current of the semiconductor devices comprising the data-retention subcircuits.

4. The data-retention circuit of claim 2 wherein the pass-gate subcircuit is to pass a latched state signal to the isolation subcircuit in response to a clock signal.

5. The data-retention circuit of claim 2 wherein the data-retention subcircuits are coupled in series in the feedback loop, and
   wherein the data-retention circuit further comprises an output inverter to receive a state signal from either the isolation subcircuit or the pass-gate subcircuit and to provide an output signal.

6. The data-retention circuit of claim 1 wherein the supply-switching subcircuit comprises a semiconductor switching subcircuit that is part of the semiconductor die,
   wherein the semiconductor switching subcircuit is to couple the data-retention subcircuits to the regular voltage supply when the semiconductor switching subcircuit receives a first state of a sleep signal, and
   wherein the leakage current biases the data-retention subcircuits when the semiconductor switching subcircuit receives a second state of the sleep signal.

7. The data-retention circuit of claim 2 further comprising a master latch to latch a state signal,
   wherein the pass-gate subcircuit, the data-retention subcircuits, the isolation subcircuit and the supply-switching subcircuit are part of a slave latch, and
   wherein the pass-gate subcircuit is to pass the latched state signal to the isolation subcircuit from the master latch in response to a clock signal.

8. The data-retention circuit of claim 7 wherein circuits of the master latch are to receive power from the regular voltage supply, and
   wherein during the standby mode the regular voltage supply is turned off.

9. A processing system comprising:
   a processor on a semiconductor die; and
   a data-retention circuit on the semiconductor die to retain state information for the processor during a standby mode, wherein the data-retention circuit comprises data-retention subcircuits, a supply switching subcircuit, and an isolation subcircuit,
   wherein the supply-switching subcircuit decouples the data-retention subcircuits from a regular voltage supply during the standby mode,
   wherein the isolation subcircuit isolates the data-retention subcircuits from a pass-gate subcircuit in response to a sleep signal,
   wherein the supply-switching subcircuit has a well tap coupled to the data retention subcircuits and the semiconductor die has a resistive n-well coupling a supplemental supply voltage to the well tap, wherein during the standby mode, the supplemental supply voltage biases the resistive n-well allowing leakage current to flow from the supplemental supply voltage through the resistive n-well to the well tap to bias the data-retention subcircuits to allow the data-retention subcircuits to remain powered and retain their state, wherein the data-retention subcircuits, the supply-switching subcircuit and the isolation subcircuit comprise lower-leakage semiconductor devices, and wherein the pass-gate subcircuit comprises higher-leakage semiconductor devices, the lower-leakage devices having at least one of a longer channel length, a thicker gate-oxide layer or a higher threshold voltage than the higher-leakage semiconductor devices.

10. The system of claim 9 wherein the isolation subcircuit and the data-retention subcircuits are outside a data path operable when voltage from the regular voltage supply is present.

11. The system of claim 9 wherein the data-retention subcircuits are arranged in cells on the semiconductor die, the cells having resistive n-wells coupling the supplemental supply voltage to at least one well tap.

12. The system of claim 10 wherein the isolation subcircuit is to pass data signals between the data-retention subcircuits and the pass-gate subcircuit when voltage from the regular voltage supply is provided.

13. The system of claim 10 wherein the pass-gate subcircuit is to pass a latched state signal to the isolation subcircuit in response to a clock signal.

14. The system of claim 13 wherein the data-retention circuit further comprises a master latch to latch a state signal, wherein the pass-gate subcircuit, the data-retention subcircuits, the isolation subcircuit and the supply-switching subcircuit are part of a slave latch, and wherein the pass-gate subcircuit is to pass the latched state signal to the isolation subcircuit from the master latch in response to the clock signal.

15. The system of claim 14 wherein circuits of the master latch are to receive current from the regular voltage supply, and wherein during the standby mode the regular voltage supply is turned off.

16. A method comprising:

isolating, with an isolation subcircuit data-retention subcircuits from a pass-gate subcircuit in response to a sleep signal;

decoupling, with a supply-switching subcircuit, the data-retention subcircuits from a regular voltage supply in response to the sleep signal during standby mode, the data-retention subcircuits, the pass-gate subcircuit and the supply-switching subcircuit being fabricated on a semiconductor die, the supply-switching subcircuit having a well tap coupled to the data retention subcircuits, the semiconductor die having a resistive n-well coupling a supplemental supply voltage to the well tap;

biasing, during standby mode with the supplemental supply voltage, the resistive n-well allowing leakage current to flow from the supplemental supply voltage through the resistive n-well to the well tap to bias the data-retention subcircuits to allow the data-retention subcircuits to remain powered and retain their state; and retaining state information by the data-retention subcircuits during the standby mode, wherein the data-retention subcircuits, the supply-switching subcircuit and the isolation subcircuit comprise lower-leakage semiconductor devices, and wherein the pass-gate subcircuit comprises higher-leakage semiconductor devices, the lower-leakage devices having at least one of a longer channel length, a thicker gate-oxide layer or a higher threshold voltage than the higher-leakage semiconductor devices.

17. The method of claim 16 wherein the isolation subcircuit and the data-retention subcircuits are outside a data path operable when voltage from the regular voltage supply is present.

18. The method of claim 16 wherein the data-retention subcircuits and supply-switching subcircuits comprise semiconductor devices fabricated on the semiconductor die.

19. The method of claim 18 further comprising passing state information between the data-retention subcircuits and the pass-gate subcircuit when the regular voltage supply is present at the isolation subcircuit.

* * * * *

UNITED STATES PATENT AND TRADEMARK OFFICE
CERTIFICATE OF CORRECTION

PATENT NO. : 7,170,327 B2 Page 1 of 1
APPLICATION NO. : 10/608055
DATED : January 30, 2007
INVENTOR(S) : Aksamit It is certified that error appears in the above-identified patent and that said Letters Patent is hereby corrected as shown below:

In column 12, line 2, in Claim 16, after "subcircuit" insert -- , --.

Signed and Sealed this

Fifteenth Day of July, 2008

JON W. DUDAS
*Director of the United States Patent and Trademark Office*